(12) United States Patent
Chen et al.

(10) Patent No.: US 10,347,548 B2
(45) Date of Patent: Jul. 9, 2019

(54) INTEGRATED CIRCUIT PACKAGE STRUCTURE AND TESTING METHOD USING THE SAME

(71) Applicant: TAIWAN SEMICONDUCTOR MANUFACTURING CO., LTD., Hsinchu (TW)

(72) Inventors: Yang-Che Chen, Hsin-Chu (TW); Tsung-Te Chou, Taipei (TW); Chen-Hua Lin, Yunlin County (TW); Huang-Wen Tseng, Hsinchu County (TW); Chwen-Ming Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 282 days.

(21) Appl. No.: 15/438,894

(22) Filed: Feb. 22, 2017

(65) Prior Publication Data

US 2018/0156865 A1     Jun. 7, 2018

Related U.S. Application Data

(60) Provisional application No. 62/430,405, filed on Dec. 6, 2016.

(51) Int. Cl.
*H01L 21/00*   (2006.01)
*H01L 21/66*   (2006.01)
(Continued)

(52) U.S. Cl.
CPC .......... *H01L 22/34* (2013.01); *G01R 31/2884* (2013.01); *H01L 21/56* (2013.01); *H01L 21/6835* (2013.01); *H01L 21/6836* (2013.01); *H01L 21/76885* (2013.01); *H01L 23/3128* (2013.01); *H01L 23/481* (2013.01); *H01L 23/528* (2013.01); *H01L 23/5226* (2013.01); *H01L 24/13* (2013.01); *H01L 24/96* (2013.01);
(Continued)

(58) Field of Classification Search
CPC ..... H01L 22/30–34; H01L 2225/06596; H01L 23/3128; H01L 24/96; H01L 24/13; H01L 25/0652; H01L 2224/12105; H01L 2224/13023; H01L 2225/06548; H01L 2225/06586; H01L 2224/02331; H01L 2224/13024; H01L 23/28–3192; H01L 21/56–568; H01L 2924/181–186
See application file for complete search history.

(56) References Cited

U.S. PATENT DOCUMENTS 9,728,474 B1 *  8/2017  Yi ............................ H01L 22/32
2009/0321734 A1 * 12/2009  Ogawa .................... H01L 22/34
                                                                    257/48
(Continued)

*Primary Examiner* — Scott B Geyer
(74) *Attorney, Agent, or Firm* — McClure, Qualey & Rodack, LLP

(57) ABSTRACT

An integrated circuit package structure includes a device die having a plurality of metal pillars, a molding material directly in contact with at least one side surface of the device die, a first dielectric layer disposed on the device die and on the molding material, and a testing pad disposed in the first dielectric layer and directly in contact with an interface between the device die and the molding material. The testing pad is electrical isolated from the metal pillars.

20 Claims, 18 Drawing Sheets

(51) Int. Cl.
*G01R 31/28* (2006.01)
*H01L 23/48* (2006.01)
*H01L 23/522* (2006.01)
*H01L 23/528* (2006.01)
*H01L 21/683* (2006.01)
*H01L 21/768* (2006.01)
*H01L 23/00* (2006.01)
*H01L 25/00* (2006.01)
*H01L 25/065* (2006.01)
*H01L 23/31* (2006.01)
*H01L 21/56* (2006.01)

(52) U.S. Cl.
CPC .......... *H01L 25/0652* (2013.01); *H01L 25/50* (2013.01); *H01L 21/568* (2013.01); *H01L 2221/68327* (2013.01); *H01L 2221/68359* (2013.01); *H01L 2224/0231* (2013.01); *H01L 2224/0239* (2013.01); *H01L 2224/02331* (2013.01); *H01L 2224/11002* (2013.01); *H01L 2224/11334* (2013.01); *H01L 2224/11849* (2013.01); *H01L 2224/12105* (2013.01); *H01L 2224/13023* (2013.01); *H01L 2224/13024* (2013.01); *H01L 2224/16227* (2013.01); *H01L 2224/16235* (2013.01); *H01L 2225/06517* (2013.01); *H01L 2225/06548* (2013.01); *H01L 2225/06555* (2013.01); *H01L 2225/06586* (2013.01); *H01L 2225/06596* (2013.01); *H01L 2924/01013* (2013.01); *H01L 2924/01029* (2013.01); *H01L 2924/01074* (2013.01); *H01L 2924/04642* (2013.01); *H01L 2924/059* (2013.01); *H01L 2924/05042* (2013.01); *H01L 2924/05442* (2013.01); *H01L 2924/06* (2013.01); *H01L 2924/0695* (2013.01)

(56) References Cited

U.S. PATENT DOCUMENTS

| | | | |
|---|---|---|---|
| 2013/0009663 A1* | 1/2013 | Gauch | H01L 22/34 324/762.01 |
| 2015/0270228 A1* | 9/2015 | Tang | H01L 21/76232 257/620 |
| 2016/0111381 A1* | 4/2016 | Werner | H01L 23/564 257/48 |
| 2016/0133593 A1* | 5/2016 | Tang | H01L 24/94 257/737 |
| 2016/0300800 A1* | 10/2016 | Zeng | H01L 23/562 |
| 2017/0162455 A1* | 6/2017 | Davis | H01L 22/14 |

* cited by examiner

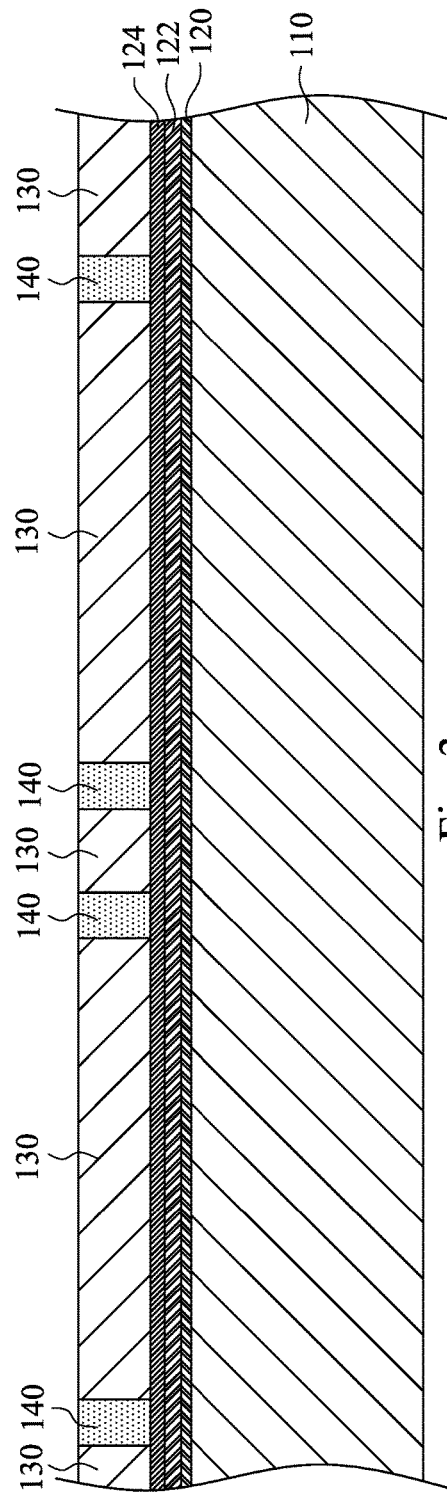
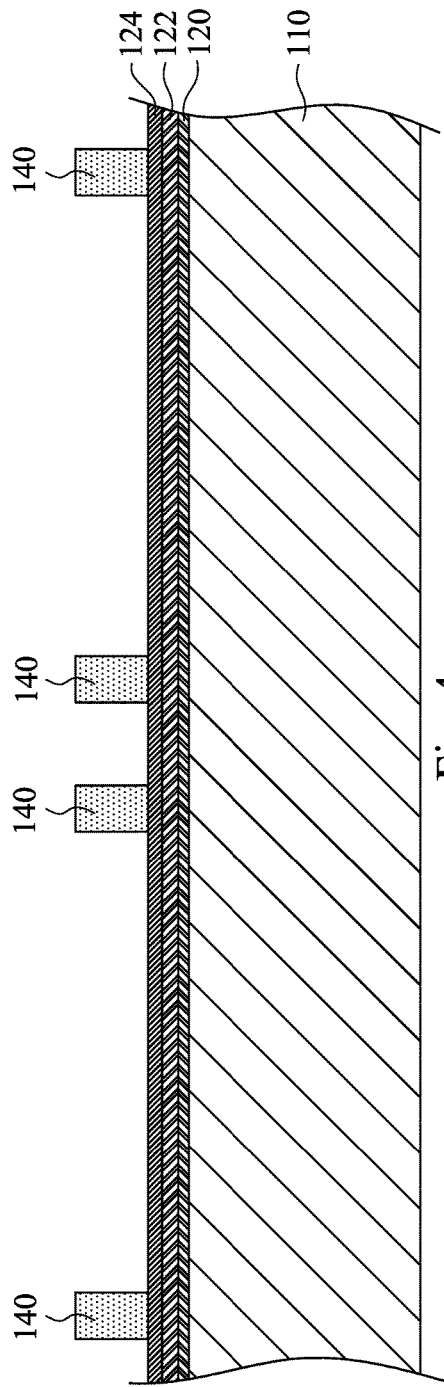
Fig. 3
Fig. 4

INTEGRATED CIRCUIT PACKAGE STRUCTURE AND TESTING METHOD USING THE SAME

RELATED APPLICATIONS

This application claims priority to U.S. Provisional Application Ser. No. 62/430,405, filed Dec. 6, 2016, which is herein incorporated by reference.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Thus, packages such as wafer level packaging (WLP) have begun to be developed, in which integrated circuits (ICs) are placed on a carrier having wiring for making connection to the ICs and other electrical components. In an attempt to further increase circuit density, three-dimensional (3D) ICs have also been developed, in which two dies or ICs are bonded together electrical connections are formed between the dies and contact pads on a substrate. These relatively new types of packaging for semiconductors face manufacturing challenges such as poor adhesion between the die and carriers, warpage, die shifting, poor moisture and photo pollution, and other reliability issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 20 are cross-sectional views and top views of intermediate stages in the manufacturing of an integrated circuit package structure in accordance with some exemplary embodiments of the present disclosure.

DETAILED DESCRIPTION

Figure 1:
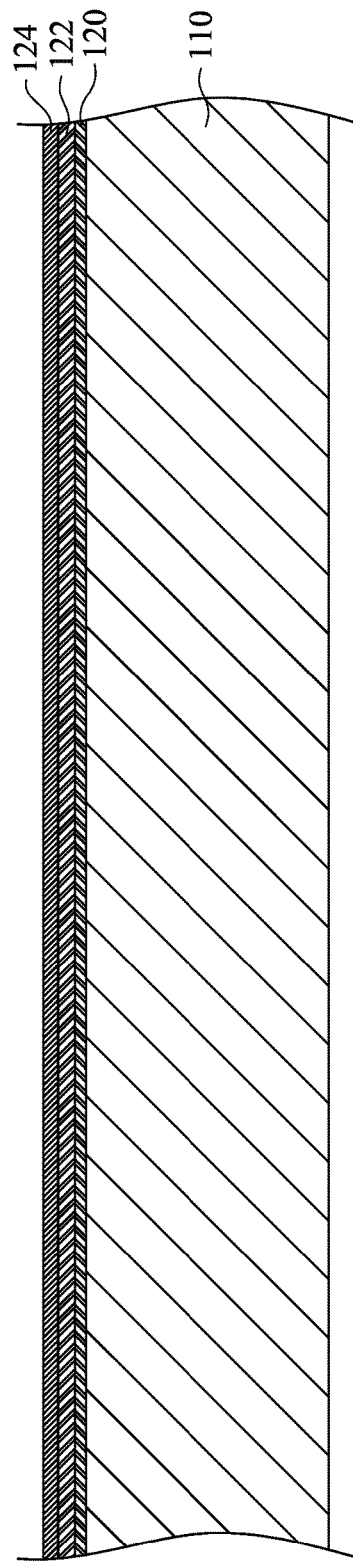

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package including through-vias and the methods of forming the same are provided in accordance with various exemplary embodiments. The intermediate stages of forming the InFO package are illustrated. The variations of the embodiments are discussed. Throughout the various views and illustrative embodiments, like reference numbers are used to designate like elements.

FIG. 1 through FIG. 20 are cross-sectional views and top views of intermediate stages in the manufacturing of an integrated circuit package structure in accordance with some exemplary embodiments of the present disclosure. Referring to FIG. 1, a carrier 110 is provided, and an adhesive layer 120 is disposed on the carrier 110. The carrier 110 may be a blank glass carrier, a blank ceramic carrier, or the like. The adhesive layer 120 may be formed of an adhesive such as ultra-violet (UV) glue, light-to-heat conversion (LTHC) glue, or the like, although other types of adhesives may be used.

In some embodiments, a buffer layer 122 and a seed layer 124 are formed over the adhesive layer 120. The buffer layer 122 is a dielectric layer, which may be a polymer layer comprising a polymer. The polymer may be, for example, polyimide, polybenzoxazole (PBO), benzocyclobutene (BCB), ajinomoto buildup film (ABF), solder resist film (SR), or the like. The seed layer 124 is formed on the buffer layer 122, for example, through physical vapor deposition (PVD) or metal foil laminating. The seed layer 124 may comprise copper, copper alloy, aluminum, titanium, titanium alloy, or combinations thereof. In some embodiments, the seed layer 124 comprises a titanium layer and a copper layer over the titanium layer. In alternative embodiments, the seed layer 124 is a copper layer.

Figure 2:
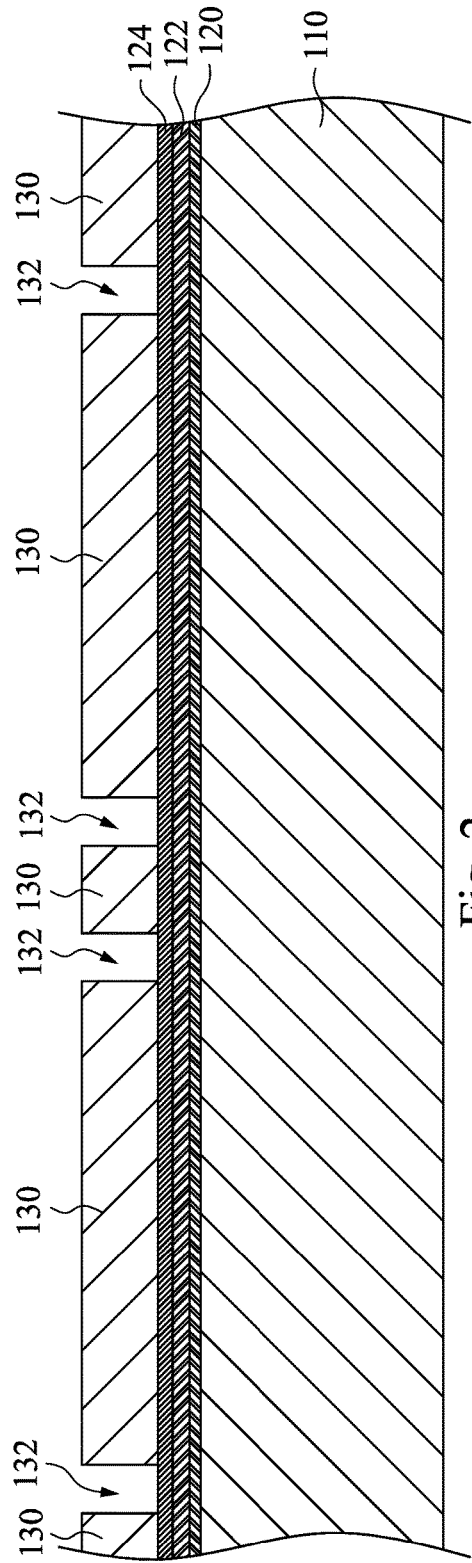

Referring to FIG. 2, a photo resist layer 130 is applied over the seed layer 124, and is then patterned. As a result, openings 132 are formed in photo resist layer 130. The photo resist layer 130 is patterned by a lithography process to form a plurality of features and openings 132 defined by the features. The lithography process may include photoresist coating, exposing, post-exposure baking, and developing.

Referring to FIG. 3, a plurality of metal features 140 are formed in photo resist layer 130 through plating, which may be electro plating or electro-less plating. The metal features 140 are plated on the exposed portions of the seed layer 124. The metal features 140 may comprise copper, aluminum, tungsten, nickel, solder, or alloys thereof. The top-view shapes of the metal features 140 may be rectangles, squares, circles, or the like. The heights of the metal features 140 are determined by the thickness of the subsequently placed device dies 150 (FIG. 6), with the heights of metal features 140 greater than the thickness of the device dies 150 in some embodiments. After the plating of the metal features 140, the photo resist layer 130 is removed, as shown in FIG. 4.

Figure 5:
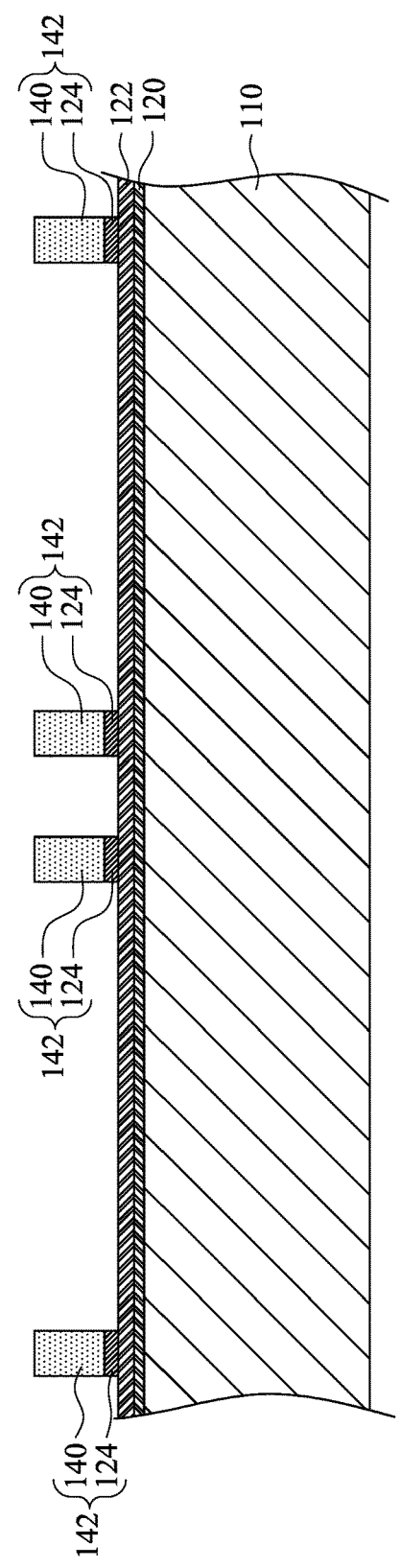

Referring to FIG. 5, an etch step is optionally performed to remove the exposed portions of seed layer 124, wherein the etching may be an anisotropic etching. The portions of seed layer 124 that are overlapped by metal features 140, on the other hand, remain not etched. Throughout the description, the metal features 140 and the remaining underlying portions of seed layer 124 are in combination referred to as through InFO vias (TIVs) 142, which are also referred to as through-vias 142.

Figure 6:
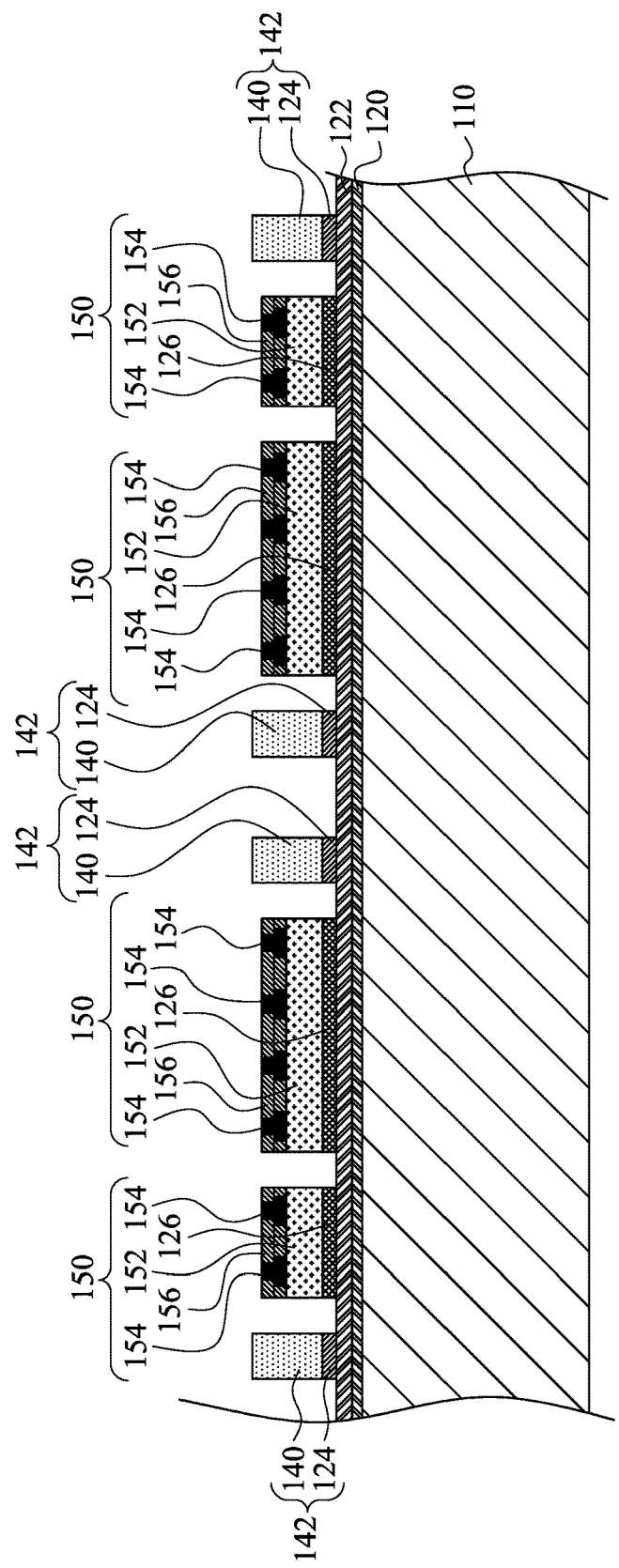

Referring to FIG. 6, a plurality of device dies 150 are disposed over the carrier 110. The device dies 150 may be adhered to buffer layer 122 through an additional adhesive layer 126. The device dies 150 may be a logic device die including logic transistors therein. In some exemplary embodiments, the device dies 150 are designed for mobile applications, and may be central computing unit (CPU) dies, power management integrated circuit (PMIC) dies, transceiver (TRX) dies, or the like. Each device die 150 includes a semiconductor substrate 152 (a silicon substrate, for example) that contacts adhesive layer 126, wherein the back surface of semiconductor substrate 152 is in contact with adhesive layer 126.

In some exemplary embodiments, a plurality of metal pillars 154 (such as copper posts) are formed as the top portion of each device die 150, and are electrically coupled to the devices such as transistors (not shown) in the device die 150. In some embodiments, a dielectric layer 156 is formed at the top surface of each device die 150, with metal pillars 154 having at least lower portions in dielectric layer 156. The top surfaces of metal pillars 154 may also be level with the top surfaces of metal pillars 154 in some embodiments. Alternatively, the dielectric layer 156 is not formed, and the metal pillars 154 protrude above a top dielectric layer of the respective device dies 150.

Figure 7:
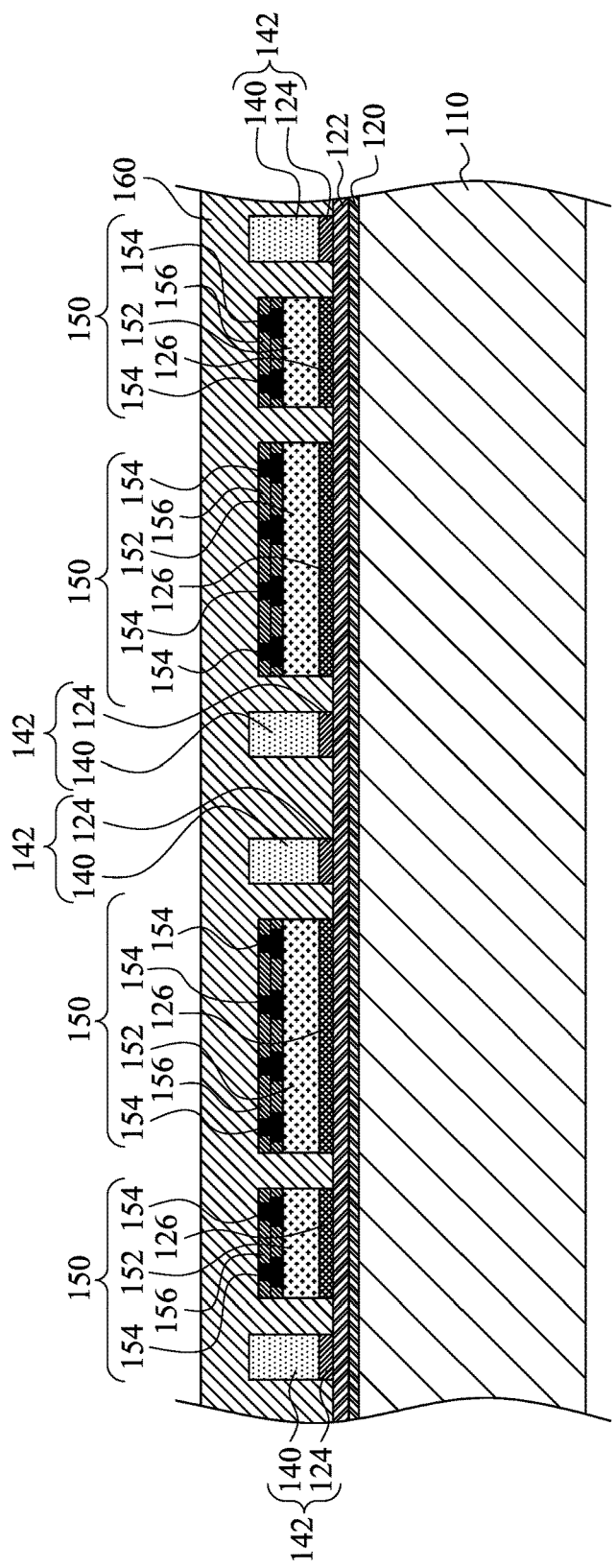

Referring to FIG. 7, a molding material 160 is molded on the device dies 150 and TIVs 142. The molding material 160 fills the gaps between device dies 150 and TIVs 142, and may be in contact with buffer layer 122. Furthermore, the molding material 160 is filled into the gaps between metal pillars 154 when metal pillars 154 are protruding metal pillars. The molding material 160 may include a molding compound, a molding underfill, an epoxy, or a resin. The top surface of molding material 160 is higher than the top ends of metal pillars 154 and TIVs 142.

Figure 8:
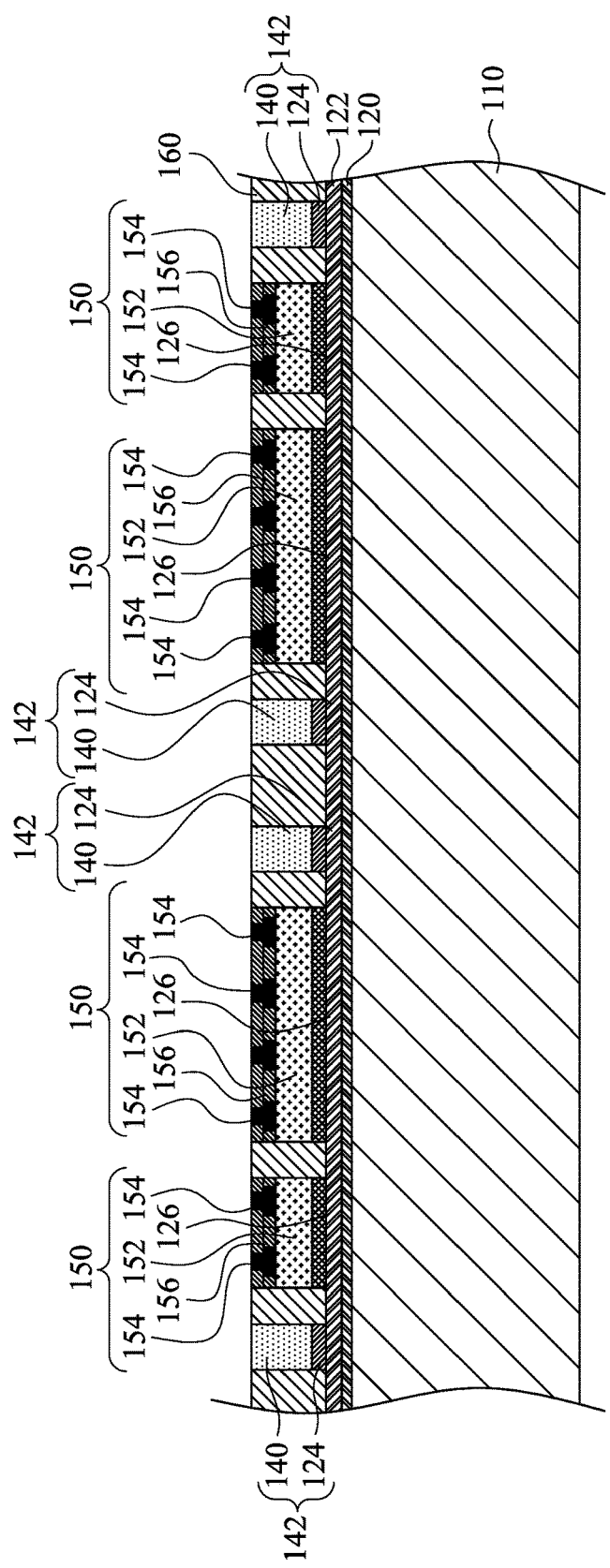
Figure 9:
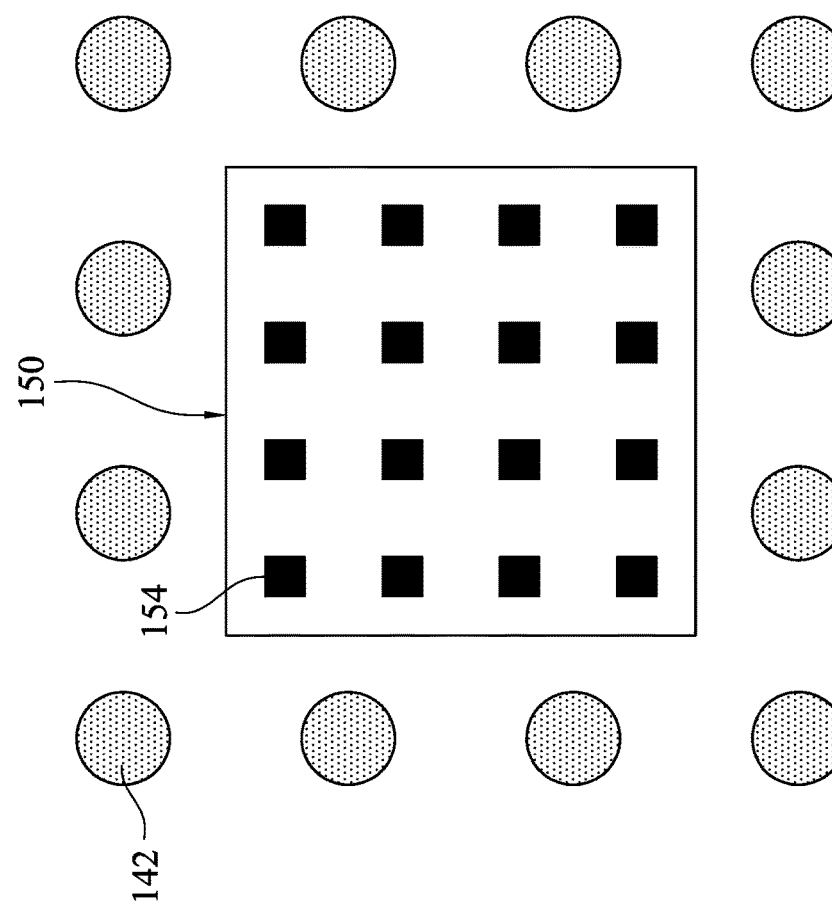

Next, a grinding step is performed to thin molding material 160, until the metal pillars 154 and TIVs 142 are exposed. The resulting structure is shown in FIG. 8 and FIG. 9, in which FIG. 8 is a cross-sectional view and FIG. 9 is a top view of a result of the structure after the grinding and cleaning processes. Due to the grinding, the top ends of the metal features 140 are substantially level (coplanar) with the top ends of metal pillars 154, and are substantially level (coplanar) with top surface of molding material 160. As a result of the grinding, metal residues such as metal particles may be generated. Accordingly, after the grinding, a cleaning may be performed, for example, through a wet etching, so that the metal residue is removed.

The device dies 150 and the TIVs 142 are surrounded by the molding material, and the top ends of the metal pillars 154, the top ends of the TIVs 142, and the top surface of the molding material 160 are substantially level (coplanar). The top ends of the metal pillars 154 and the top ends of the TIVs 142 are exposed from the molding material.

Figure 10:
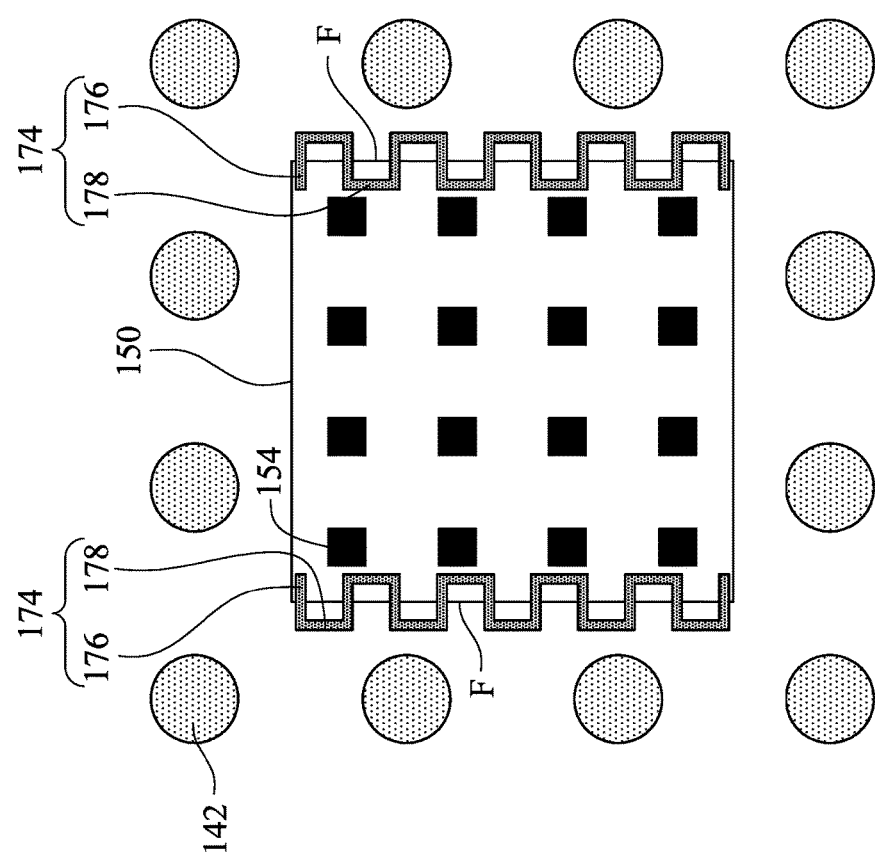
Figure 11:
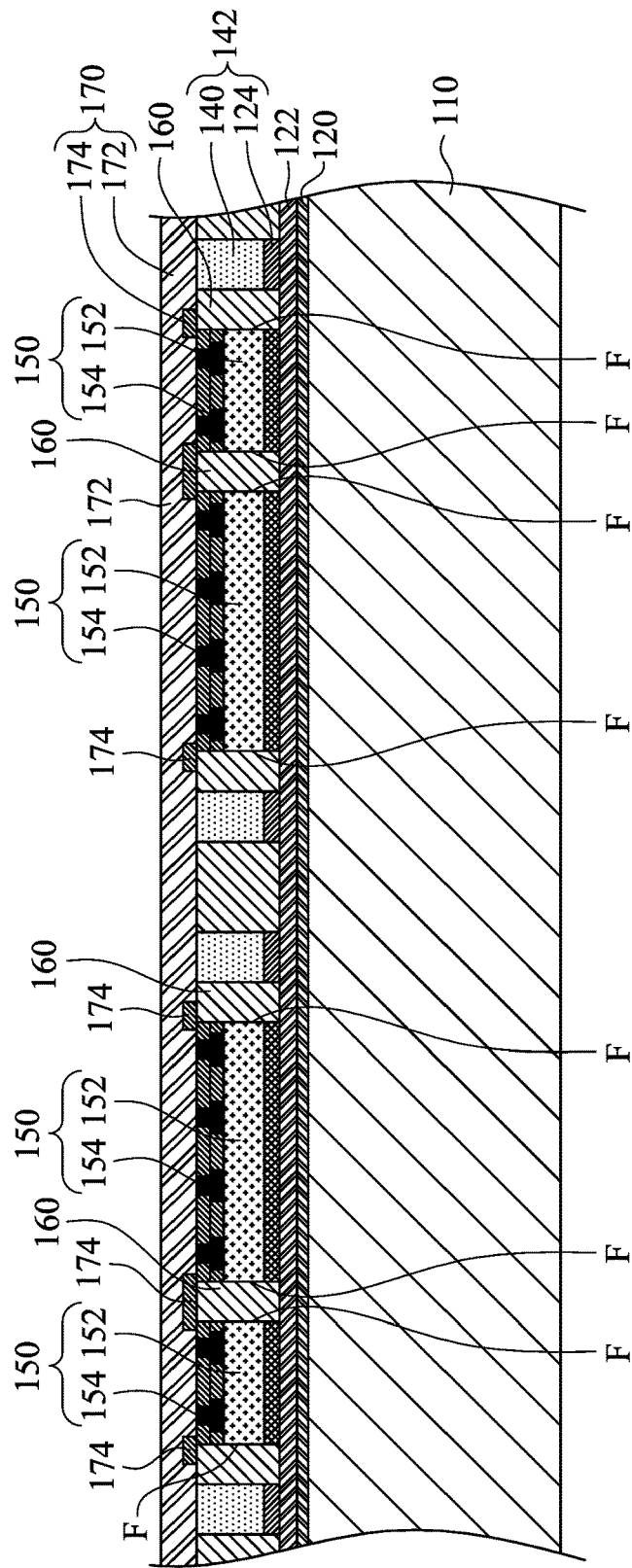

After the grinding and cleaning processes are performed, a wiring layer is formed on the molding material 160, the device dies 150, and the TIVs 142. Reference is made to both FIG. 10 and FIG. 11, in which FIG. 10 is a partial top view after the wiring layer is formed, and FIG. 11 is a cross-sectional view of the structure after the wiring layer is formed. The wiring layer 170 comprises a first dielectric layer 172 and a plurality of testing pad 174 disposed in the first dielectric layer 172. The first dielectric layer 172 can be an oxide layer, and the testing pads 174 are metal features disposed in the first dielectric layer 172. The testing pads 174 are disposed on peripheral region of the device dies 150 and the adjacent molding material 160.

The device dies 150 are placed on the carrier 110 and are encircled and fastened by the molding material 160. The molding material 160 is directly in contact with at least one side surface of each device die 150, and an interface F is defined between the molding material 160 and the device dies 150. Because the device dies 150 and the molding material 160 are respectively made of different materials, the interface F is a heterogeneous interface, and thus the bonding between the device dies 150 and the molding material 160 may be insufficient. The insufficient bonding may cause delamination, which further leads to issues such as dielectric cracking, die shifting, poor moisture and photo pollution, and other reliability issues.

The testing pads 174 are utilized to inspect whether there is a delamination at the interface F between the molding material 160 and the device dies 150. The testing pads 174 are disposed in the first dielectric layer 172 and are directly in contact with the interface F between the molding material 160 and the device dies 150. The testing pads 174 are disposed in the first dielectric layer 172 and are directly in contact with the device dies 150, the molding material 160, and the interface F therebetween. The testing pads 174 are thin metal lines, and the test pads 174 are serpentine patterns, in top view.

For example, as illustrated in FIGS. 10 and 11, each testing pad 174 may include a plurality of first sections 176 and a plurality of second sections 178. Two opposite ends of each of the first sections 176 are respectively disposed on the device dies 150 and the molding material 160. That is, the first sections 176 are formed on the top surface of each device die 150 and the molding material 160 and bridge the device die 150 and the molding material 160. In some embodiments, the first sections 176 are rectangular, and the major axis of each of the first sections 176 is substantially perpendicular to the interface F. The second sections 178 are disposed on the top surface of the molding material 160 or on the top surface of each device die 150 and interconnect the first sections 176. For example, some of the second sections 178 are disposed on the molding material 160 to interconnect some of the ends of the first sections, and others of the second sections 178 are disposed on the device dies 150 to interconnect some other ends of the first sections 176. In some embodiments, the first sections 176 and the second sections 178 are serially connected. That is, the electrical signal can be transmitted from one end of the testing pad 174 to another end of the testing pad 174, and there is no branch on the testing pad 174.

The testing pad 174 is utilized to detect whether there is a delamination at the interface F. In some embodiments, when the unwanted delamination issue is raised at the interface F between the device dies 150 and the molding material 160 in the following processes, the stretching stress caused by delamination is conducted to the testing pad 174, which is directly in contact with the to surface of the molding material 160 and the device dies 150. Because the testing pad 174 is a thin metal line, and the stretching stress applied to the testing pad 174 is huge, the stretching stress may deform and break the testing pad 174. Thus the electrical signal cannot be transmitted from one end to another end of the broken testing pad 174. That is, the test result of the testing pad 174 is short means no delamination; the test result of the testing pad 174 is open means delamination.

In some embodiments, the formation of the testing pad 174 and the first dielectric layer 172 includes forming a blanket copper seed layer, forming and patterning a mask layer over the blanket copper seed layer, performing a plating to form the testing pad 174, removing the mask layer, and performing a flash etching to remove the portions of the blanket copper seed layer not covered by testing pad 174. In alternative embodiments, the testing pad 174 are formed by depositing metal layer, patterning the metal layers, and fill the gaps between testing pad 174 with the first dielectric layer 172. The material of the testing pad 174 may comprise a metal or a metal alloy including aluminum, copper, tungsten, and/or alloys thereof. The material of the first dielectric layer 172 in these embodiments may comprise a polymer such as polyimide, benzocyclobutene, polybenzoxazole, or the like. Alternatively, the first dielectric layer 172 may include non-organic dielectric materials such as silicon oxide, silicon nitride, silicon carbide, silicon oxynitride, or the like.

In some embodiments, the number of the testing pad 174 for each device die 150 can be plural. The testing pads 174 are disposed at the edges of the device die 150. In some other embodiments, the number of the testing pad 174 for each device die 150 is one, and the testing pad 174 is disposed surrounding the edges of the device die 150.

Figure 12:
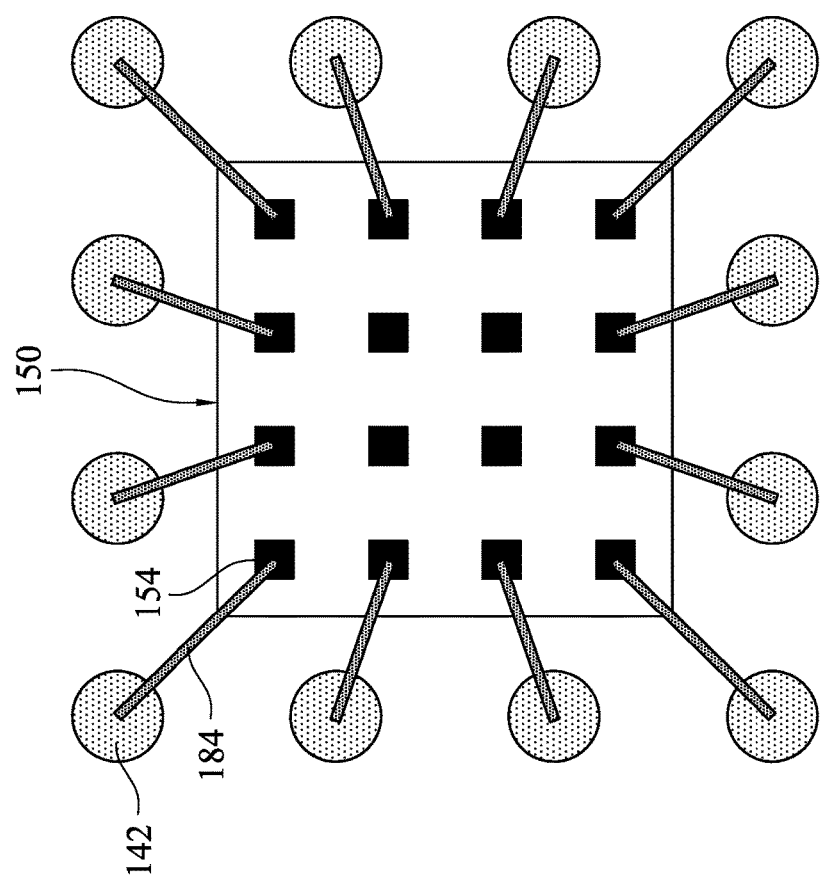
Figure 13:
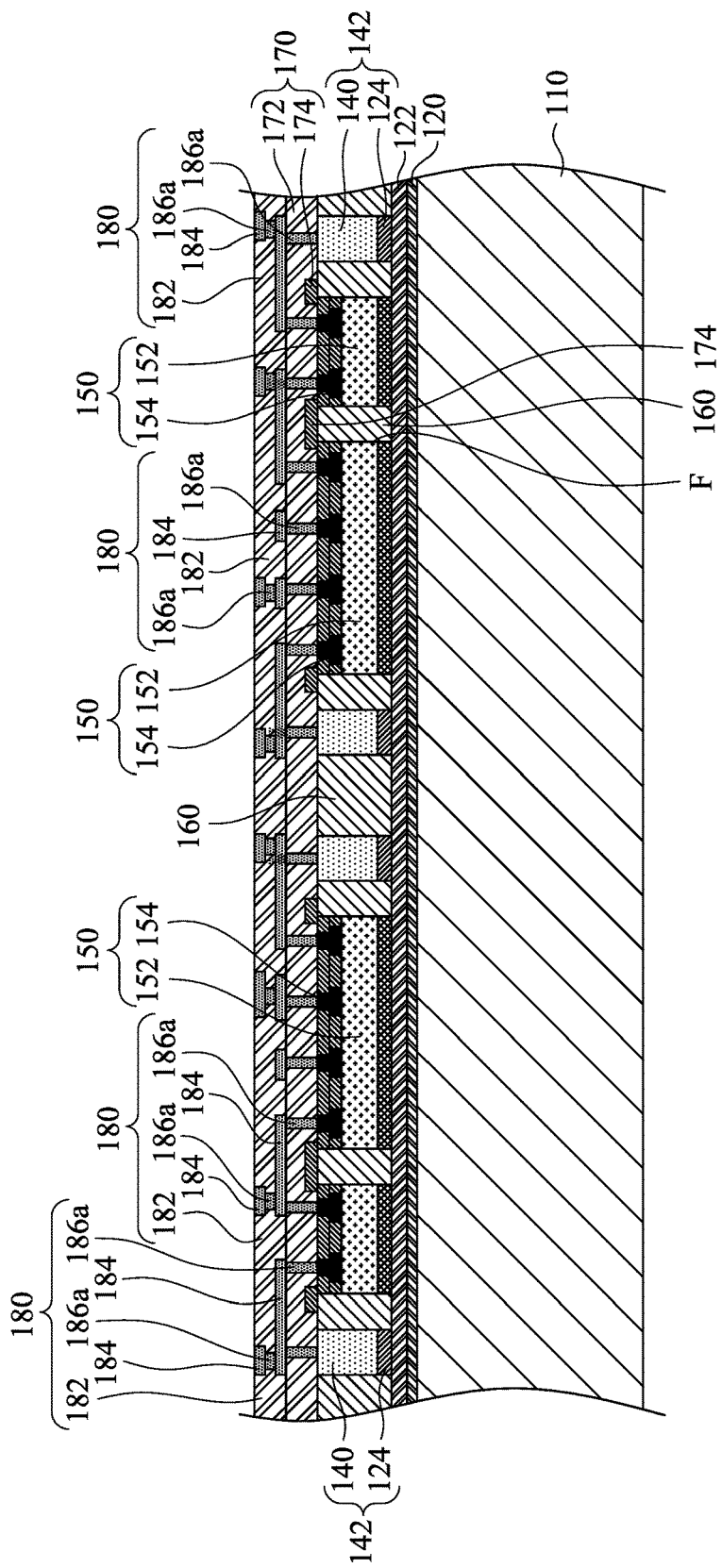
Figure 14:
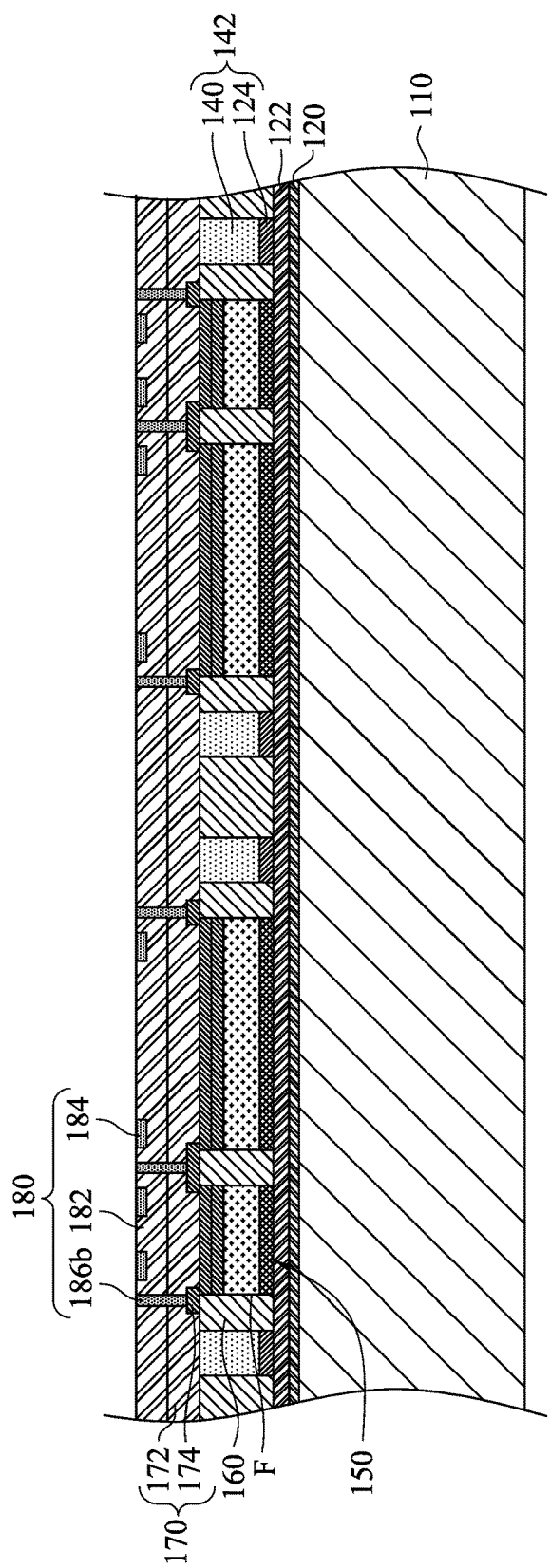

After the wiring layer 170 is formed on the device dies 150 and on the molding material 160, a redistribution layer 180 is formed on the wiring layer 170. The partially top view and the cross-sectional view thereof are illustrated in FIG. 12, and FIGS. 13 and 14, in which the cross section of FIG. 13 is misaligned with FIG. 14. Referring to FIG. 12 and FIG. 13, the redistribution layer 180 includes one or more second dielectric layers 182 disposed on the first dielectric layer 172, and a plurality of redistribution lines 184 in the second dielectric layer 182. The redistribution lines 184 are utilized to interconnect the metal pillars 154 and the TIVs 142, respectively. In some embodiments, the redistribution layer 180 further includes a plurality of first vias 186a disposed in the first dielectric layer 172 and the second dielectric layer 182. The redistribution lines 184 and the metal pillars 154 or the redistribution lines 184 and the TIVs 142 are interconnected by the first vias 186a.

Unlike the testing pad 174 is directly in contact with the interface F between the device dies 150 and the molding material 160, the redistribution lines 184 are not directly in contact with the interface F between the device dies 150 and the molding material 160. For example, the redistribution lines 184 and the interface F are spaced by the first dielectric layer 172, thus the stretching stress by delamination would be conducted to the first dielectric layer 172 and the testing pad 174 instead of the redistribution lines 184. The redistribution lines 184 are isolated from the testing pad 174. Therefore, in some embodiments, the redistribution lines 184 and the testing pad 174 are not arranged coplanar. For example, the testing pad 174 is disposed at a lower level, and the redistribution lines 184 are disposed at a higher level.

The redistribution lines 184 are formed over molding material 160 to connect to the metal pillars 154 and the TIVs 142. The redistribution lines 184 may also interconnect the metal pillars 154 and the TIVs 142. In accordance with various embodiments, the redistribution lines 184 are formed in one or more second dielectric layers 182. In some embodiments, the formation of one layer of the redistribution lines 184 and second dielectric layer 182 includes forming a blanket copper seed layer, forming and patterning a mask layer over the blanket copper seed layer, performing a plating to form the redistribution lines 184, removing the mask layer, and performing a flash etching to remove the portions of the blanket copper seed layer not covered by redistribution lines 184. In alternative embodiments, the redistribution lines 184 are formed by depositing metal layer on the first dielectric layer 172, patterning the metal layers, and fill the gaps between redistribution lines 184 with the second dielectric layer 182. The material of the redistribution lines 184 may comprise a metal or a metal alloy including aluminum, copper, tungsten, and/or alloys thereof.

FIG. 13 illustrates two layers of the redistribution lines 184, while there may be more than two layers of the redistribution lines 184, depending on the routing requirement of the respective package. The material of the second dielectric layer 182 in these embodiments may comprise a polymer such as polyimide, benzocyclobutene, polybenzoxazole, or the like. Alternatively, the second dielectric layer 182 may include non-organic dielectric materials such as silicon oxide, silicon nitride, silicon carbide, silicon oxynitride, or the like.

Referring to FIG. 14, the redistribution layer 180 further includes a plurality of second vias 186b in the first dielectric layer 172 and the second dielectric layer 182. The second vias 186b are connected to the testing pads 174. The testing pads 174 are not electrically connected to the redistribution lines 184, the TIVs 142, or the metal pillars 154 (shown in FIG. 13). In some embodiments, the second vias 186b are connected to opposite ends of each testing pad 174 and are exposed from the second dielectric layer 182, such that the testing probes to detect delamination can be electrical connected to the testing pads 174 through the second vias 186b. In order to test whether there is a delamination at the interface F between the device dies 150 and the molding material 160, probes can respectively touch the second vias 186b. The test result of the testing pad 174 is short means current may pass through the corresponding testing pad 174 from one probe to another, e.g., there is no delamination; the test result of the testing pad 174 is open means the testing pad 174 is broken by the stressing stress, thus the current cannot pass through the testing pad 174, e.g., there is a delamination.

Figure 15:
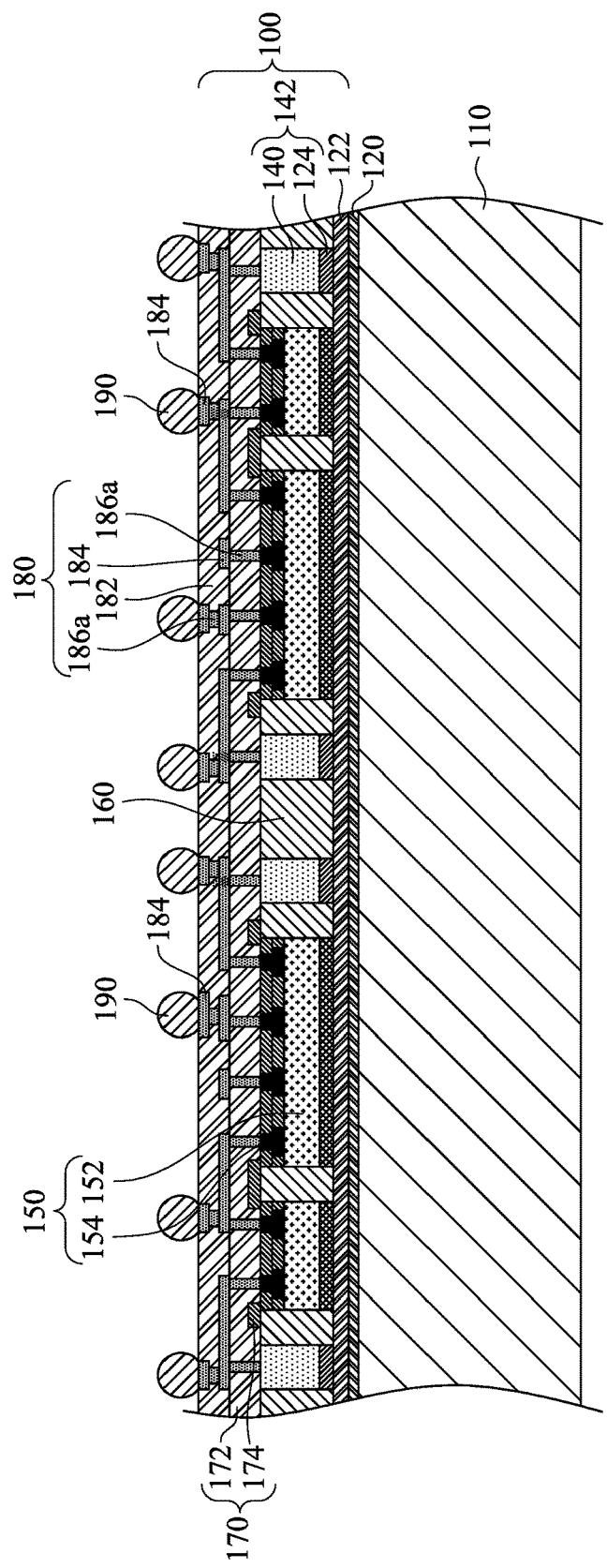

FIG. 15 illustrates the formation of electrical connectors 190 in accordance with some exemplary embodiments, in which the cross-section of FIG. 15 is taken along the view of FIG. 13. The formation of the electrical connectors 190 may include placing solder balls on the exposed portions of the redistribution lines 184 (or Under-Bump Metallurgies (if formed, not shown)), and then reflowing the solder balls. In alternative embodiments, the formation of electrical connectors 190 includes performing a plating step to form solder regions over the redistribution lines 184, and then reflowing the solder regions. The electrical connectors 190 may also include metal pillars, or metal pillars and solder caps, which may also be formed through plating. Throughout the description, the combined structure including device dies 150, TIVs 142, molding material 160, the wiring layer 170, the overlying redistribution layer 180, and the buffer layer 122 is referred to as TIV package 100, which may be a composite wafer.

Figure 16:
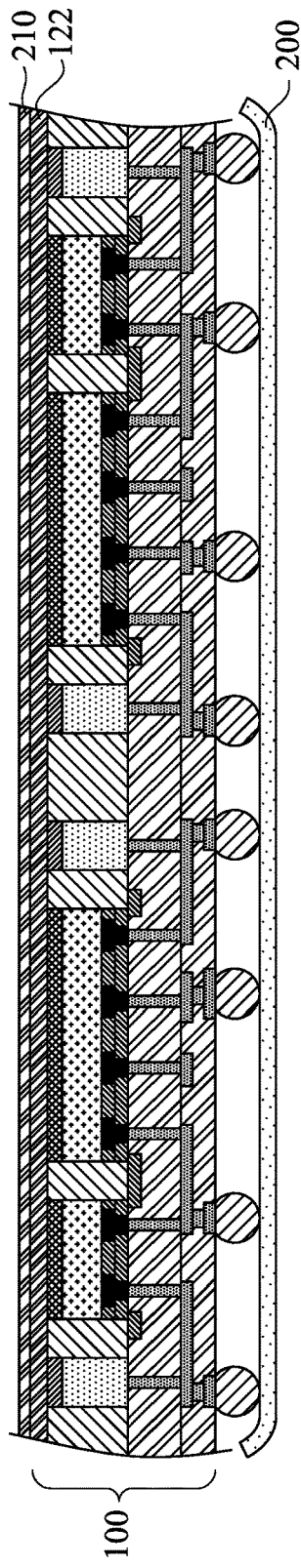

Next, the TIV package 100 is de-bonded from the carrier 110. The adhesive layer 120 is also cleaned from TIV package 100. The resulting structure is shown in FIG. 16. As a result of the removal of adhesive layer 120, the buffer layer 122 is exposed. The TIV package 100 is further adhered to a dicing tape 200, wherein the electrical connectors 190 face toward, and may contact, the dicing tape 200. In some embodiments, the laminating film 210 is placed onto the exposed buffer layer 122, wherein the laminating film 210 may comprises SR, ABF, backside coating tape, or the like. In alternative embodiments, no laminating film 210 is placed over the buffer layer 122.

Figure 17:
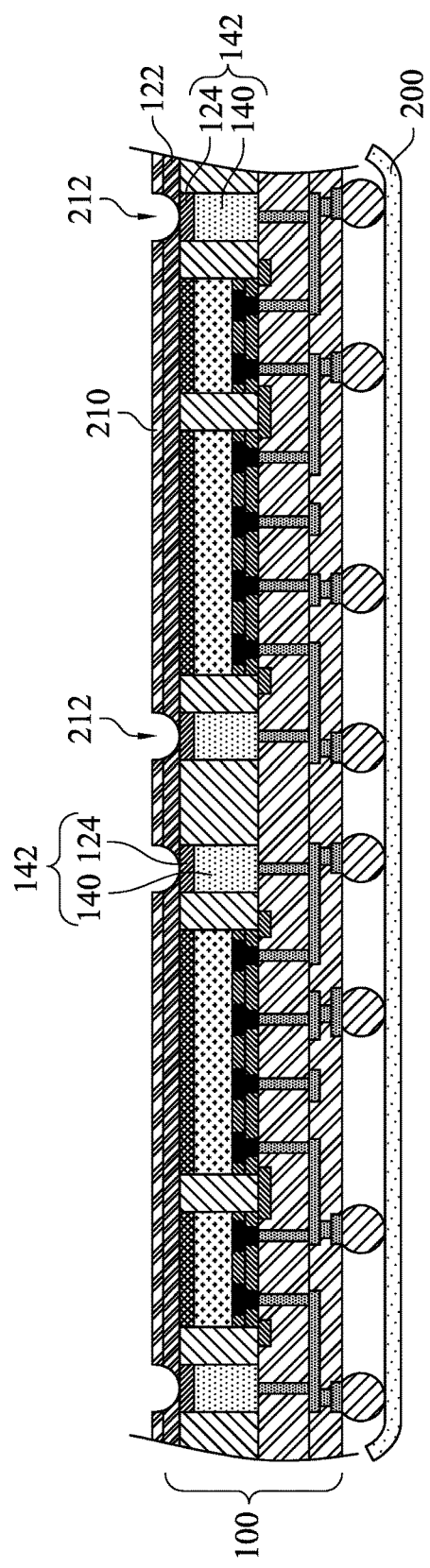

FIG. 17 illustrates the opening 212 of the buffer layer 122 and the laminating film 210 (if any). The openings 212 are formed in buffer layer 122 and the laminating film 210. In accordance with some embodiments, the openings 212 are formed through laser drill, although photolithography processes may also be used. The TIVs 142 are exposed through the openings 212.

Figure 18:
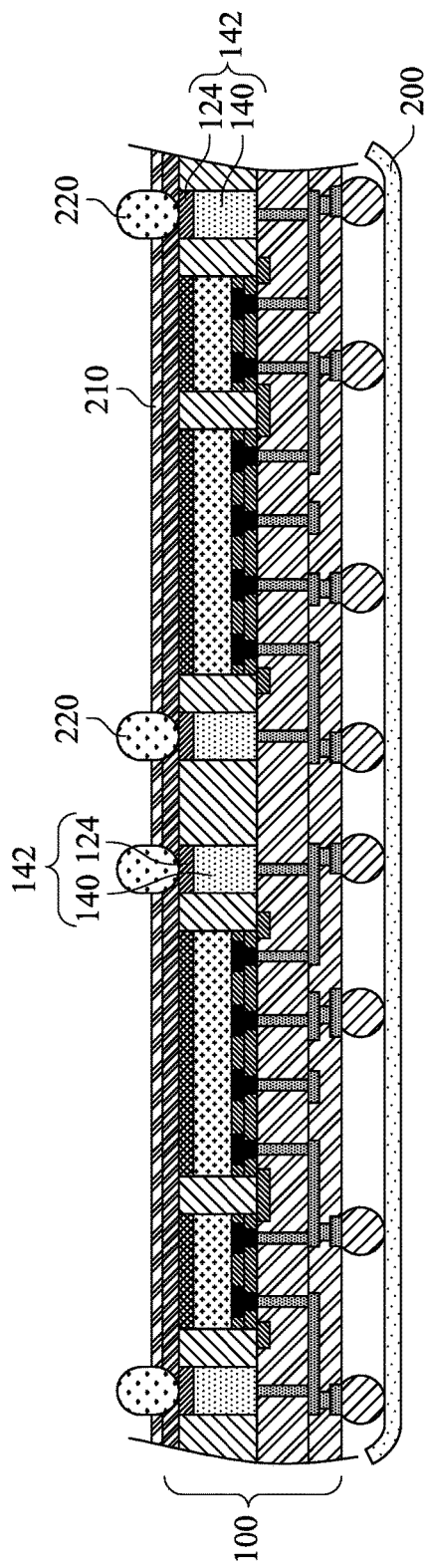

Next, in FIG. 18, a plurality of solder regions 220 are formed on the exposed TIVs 142. Formation of the solder regions 220 may include printing solder paste onto top surfaces of the exposed TIVs 142. In some embodiments, the solder paste includes solder alloy, flux, solvent, at least one surfactant, and at least one antioxidant. The solder alloy is a combination of metals that can be melted and used to join two metal surfaces. The flux creates a wettable surface for the solder alloy by removing oxides and other contaminants from the metal to be joined. The solvent prevents the flux from sublimating or polymerizing when the solder paste is heated. The surfactant reduces the surface tension at the interface between the solder paste and the metal to be joined to further promote wetting of the solder alloy. The antioxidant prevents reoxidation of the surface of the metal to be joined after the flux has prepared the surface of the metal to be joined for soldering.

The solder paste may be printed on the exposed TIVs 142 with a stencil printer. A stencil is a metal sheet that has laser-cut or chemically etched apertures that match the exposed TIVs 142. The stencil printer has two squeegees: one for a forward stroke and another for a reverse stroke. During printing, the solder paste is rolled in front of a squeegee to fill the apertures in the stencil. Then, the squeegee moves over the stencil and shears off the solder paste in the openings. The pressure generated by the squeegee injects the solder paste into the apertures and onto the exposed TIVs 142 thereby forming the solder regions 220.

Figure 19:
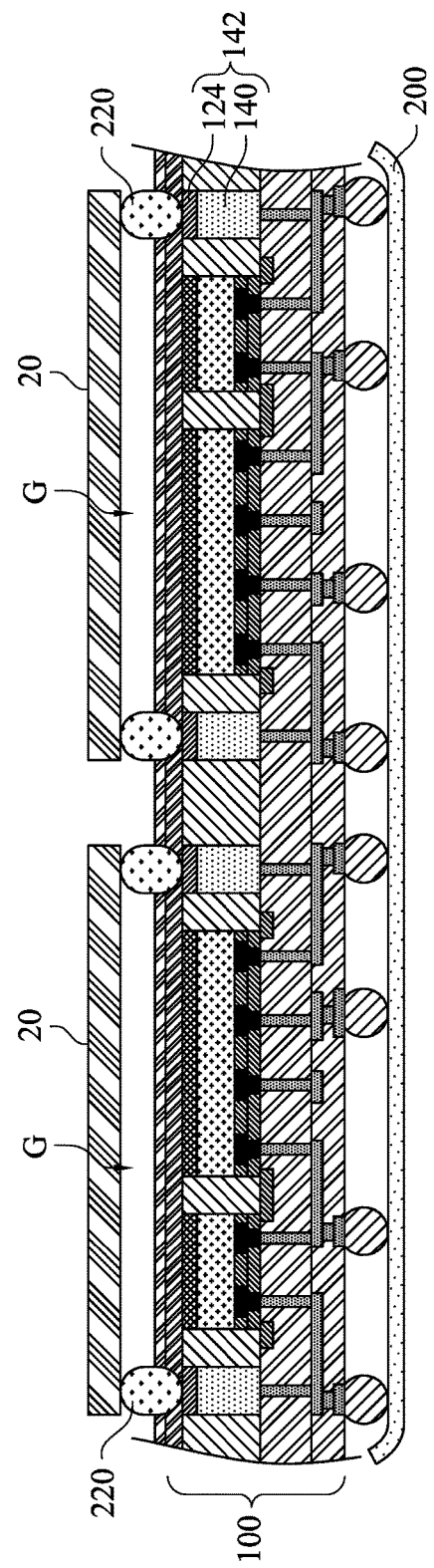

FIG. 19 illustrates the bonding of top package 20 to the TIV package 100, wherein the bonding may be through solder regions 220. Throughout the description, TIV package 100 is also referred to as bottom package 100 since it may act as the bottom packages, as shown in FIG. 19. In some embodiments, the top package 20 includes device dies bonded to a package substrate. The device dies may include a memory die(s), which may be, for example, a static random access memory (SRAM) die, a dynamic random access memory (DRAM) die, or the like. The bottom surface of top package 20 and the top surface of TIV package 100 are spaced apart from each other by gap G.

Figure 20:
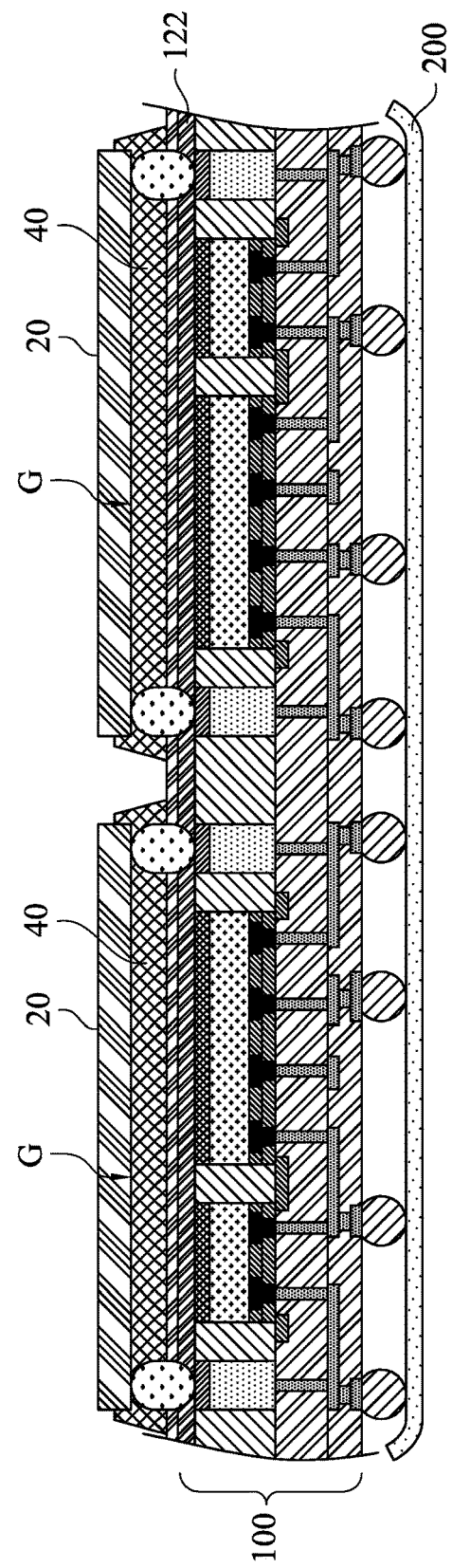
Figure 21:
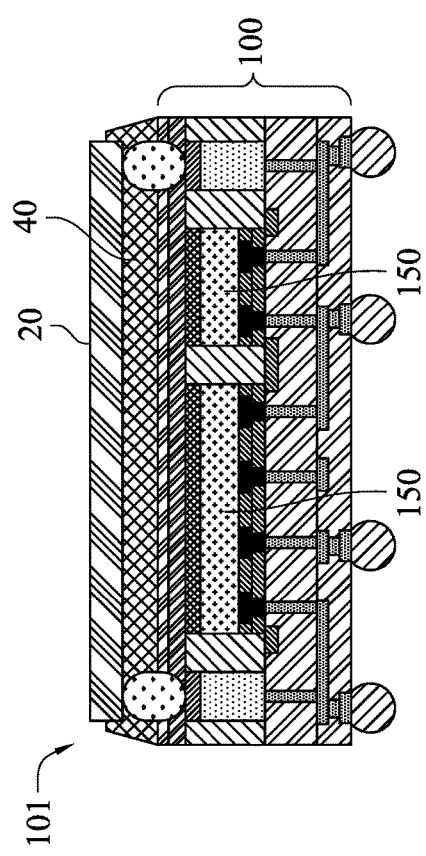
FIG. 21 through FIG. 23 are cross-sectional views of the integrated circuit package structure in accordance with different exemplary embodiments of the present disclosure.
Figure 22:
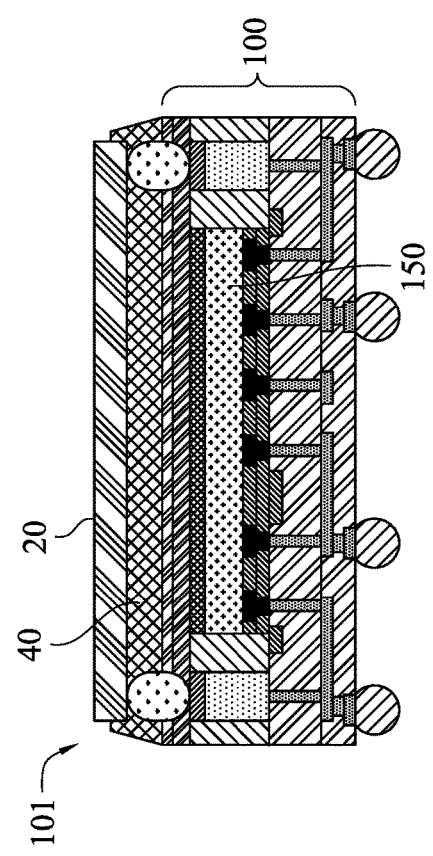

FIG. 20 illustrates dispensing of underfills 40 respectively into the gaps G between the top packages 20 and the TIV package 100. The underfills 40 fill gaps G may be in contact with the buffer layer 122 and the top packages 20. Next, a singulation process is carried out to saw the TIV package 100, such that a plurality of package structures 101 is formed. The embodiments of the resulting structure of one of the package structures 101 are shown in FIG. 21, in which the package structure 101 in FIG. 21 contains multiple device dies 150. In some other embodiments, the package structure 101 contains singular device die 150, as shown in FIG. 22.

Figure 23:
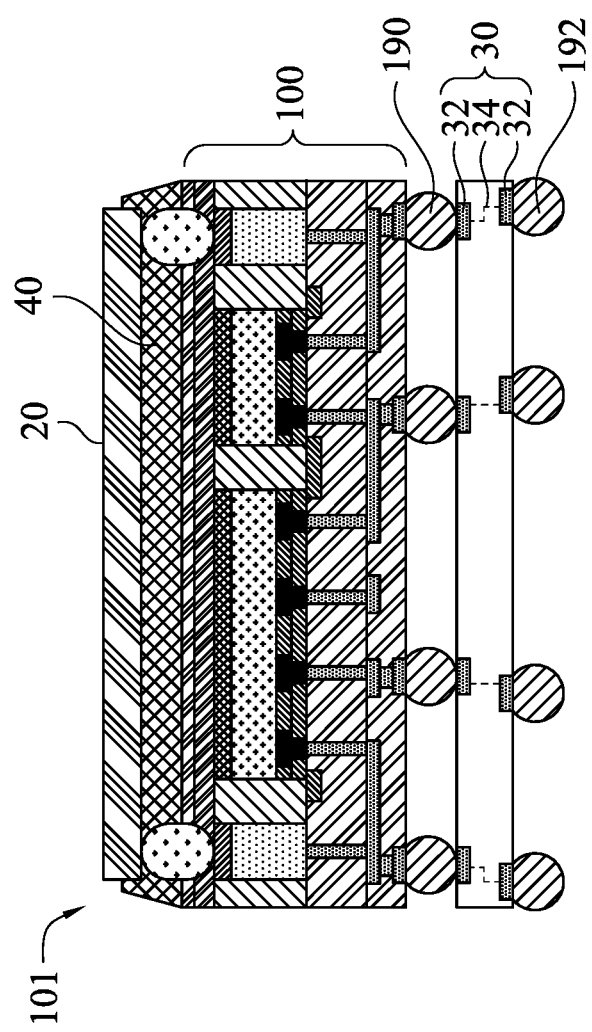

In some other embodiments, such as the embodiments in FIG. 23, alternatively, the bonded top package 20 and TIV package 100 are further bonded to another package component 30, which may be a package substrate in some embodiments. In alternative embodiments, the package component 30 comprises a printed circuit board (PCB). The package component 30 may have electrical connectors 32 (such as metal pads or metal pillars) on opposite sides, and metal traces 34 interconnecting the electrical connectors 32. Furthermore, additional electrical connectors 192 are formed on electrical connector 32 of the package component 30.

According to above embodiments, the integrated circuit package structure includes a testing pad in contact with the interface between the device die and the molding material. The testing pad and the redistribution lines are at different levels, and the testing pad is utilized to test whether there is a delamination at the interface, in which the stretching stress generated by the delamination is conducted to the testing pad and break current path of the testing pad.

According to some embodiments of the disclosure, an integrated circuit package structure includes a device die comprising a plurality of metal pillars, a molding material directly in contact with at least one side surface of the device die, a first dielectric layer disposed on the device die and on the molding material, and a testing pad disposed in the first dielectric layer and directly in contact with an interface between the device die and the molding material. The testing pad is electrical isolated from the metal pillars.

According to some embodiments of the disclosure, an integrated circuit package structure includes a device die comprising a plurality of metal pillars, a molding material directly in contact with at least one side surface of the device die, a plurality of through-vias disposed in the molding material, a plurality of redistribution lines interconnecting the metal pillars and the through-vias, respectively, and a testing pad disposed directly in contact with an interface between the device die and the molding material. The testing pad is electrical isolated from the redistribution lines.

According to some embodiments of the disclosure, a method of detecting delamination in an integrated circuit package structure is provided. The method includes providing a the integrated circuit package structure, in which the integrated circuit package structure comprises a testing pad in contact with an interface between a device die and a molding material. Then, a current is applied to the testing pad and detecting the testing pad is open or short, wherein a delamination is found when a result of the testing pad is open.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit package structure, comprising:
a device die comprising a plurality of metal pillars;
a molding material directly in contact with at least one side surface of the device die;

a first dielectric layer disposed on the device die and on the molding material; and a testing pad disposed in the first dielectric layer and directly in contact with an interface between the device die and the molding material, wherein the testing pad is electrical isolated from the metal pillars.

2. The integrated circuit package structure of claim 1, further comprising:
at least one second dielectric layer disposed on the testing pad and on the first dielectric layer; and
two vias disposed in the second dielectric layer, wherein the vias are connected to two opposite ends of the testing pad, respectively.

3. The integrated circuit package structure of claim 1, further comprising:
a plurality of redistribution lines disposed above the first dielectric layer, wherein the redistribution lines are respectively connected to the metal pillars of the device die, and the redistribution lines and the interface are spaced by the first dielectric layer.

4. The integrated circuit package structure of claim 3, further comprising:
at least one second dielectric layer disposed on the first dielectric layer, wherein the redistribution lines are disposed in the second dielectric layer and are electrical isolated from the testing pad.

5. The integrated circuit package structure of claim 4, further comprising:
a plurality of electrical connectors disposed on the second dielectric layer and connected to at least some of the redistribution lines.

6. The integrated circuit package structure of claim 3, further comprising a plurality of though-vias disposed in the molding material, wherein the through-vias are connected to at least some of the redistribution lines, respectively.

7. The integrated circuit package structure of claim 6, further comprising a plurality of solder regions connected to the through-vias.

8. The integrated circuit package structure of claim 6, wherein the redistribution lines interconnect the through-vias and the metal pillars, respectively.

9. The integrated circuit package structure of claim 6, wherein the testing pad is electrical isolated from the through-vias.

10. The integrated circuit package structure of claim 1, wherein the testing pad is a serpentine pattern.

11. An integrated circuit package structure, comprising:
a device die comprising a plurality of metal pillars;
a molding material directly in contact with at least one side surface of the device die;
a plurality of through-vias disposed in the molding material;
a plurality of redistribution lines interconnecting the metal pillars and the through-vias, respectively; and
a testing pad disposed directly in contact with an interface between the device die and the molding material, wherein the testing pad is electrical isolated from the redistribution lines.

12. The integrated circuit package structure of claim 11, wherein the testing pad comprises:
a plurality of first sections, wherein two opposite ends of the each of the first sections are respectively disposed on the device die and on the molding material; and
a plurality of second sections configured to connect the first sections.

13. The integrated circuit package structure of claim 12, wherein the first sections and the second sections are serially connected.

14. The integrated circuit package structure of claim 12, wherein a major axis of each of the first sections is substantially perpendicular to the interface.

15. The integrated circuit package structure of claim 11, wherein the testing pad and the redistribution lines are at different levels.

16. The integrated circuit package structure of claim 11, wherein the testing pad and the metal pillars are electrical isolated.

17. The integrated circuit package structure of claim 11, wherein the testing pad and the through-vias are electrical isolated.

18. The integrated circuit package structure of claim 11, wherein the testing pad is a serpentine metal line.

19. An integrated circuit package structure, comprising:
a device die comprising a metal pillar;
a molding material adjacent to a side surface of the device die;
a redistribution line directly in contact the metal pillar; and
a testing pad directly in contact with a top surface of the device die and a top surface of the molding material and electrical isolated from the redistribution line.

20. The integrated circuit package structure of claim 19, wherein the testing pad is in contact with an interface between the device die and the molding material.

* * * * *